United States Patent [19]
Lillington et al.

[11] Patent Number: 5,853,497
[45] Date of Patent: Dec. 29, 1998

[54] HIGH EFFICIENCY MULTI-JUNCTION SOLAR CELLS

[75] Inventors: David R. Lillington, Rancho Palos Verdes; David E. Joslin, Valley Village, both of Calif.

[73] Assignee: Hughes Electronics Corporation, Los Angeles, Calif.

[21] Appl. No.: 764,805

[22] Filed: Dec. 12, 1996

[51] Int. Cl.$^6$ .............................. H01L 25/00; H01L 31/00
[52] U.S. Cl. ........................................... 136/249; 136/262
[58] Field of Search ................................ 136/249 TJ, 262

[56] References Cited

U.S. PATENT DOCUMENTS 5,330,585   7/1994   Chang et al. ............................ 136/256

OTHER PUBLICATIONS

Wanlass et al., "Development of High–Performance GaIn-AsP Solar Cells For Tandem Solar Cell Application", *Proceedings of the 21st IEEE Photovoltaic Specialists Conference*, 1990, pp. 172–178.

Fan et al., "Optimal Design of High–Efficiency Tandem Cells", *16th IEEE Photovoltaic Specialists conference*, 1982, pp. 692–701.

Chiang et al., Large Area GaInp$_2$/GaAs/Ge Multijunction Solar Cells For Space Applications, *First WPEC*, Hawaii, Dec. 5–9, 1994, pp. 212–2123.

Kurtz et al., "19.6% Electron0Irradiated GaInP/GaAs Cells", *First WCPEC*, Hawaii, Dec. 5–9, 1994, pp. 2108–2111.

Piszczor et al., A High Performance Photovoltaic concentrator Array: the Mini–Dome Fresnel Lens Concentrator with 30% Efficient GaAs/GaSb Tandem Cells, *Proceedings of the 22nd IEEE Photovoltaic Specialists Conference*, 1991, pp. 1485–1490.

Kitchen et al.,Teflon Bonding of Solar Cell Assemblies Using Pilkington CMZ & CMG Cover–glass—Now a Production Process, *First WCPEC*, Hawaii, Dec. 5–9, 1994, pp. 2058–2061.

Yablonovitch et al., Extreme Selectivity in the Lift–off of Epitaxial GaAs Films, *Applied Physics Letter*, vol. 51, No. 26, 28 Dec. 1987, pp. 2222–2224.

*Primary Examiner*—Mark Chapman
*Attorney, Agent, or Firm*—Elizabeth E. Leitereg; Terje Gudmestad; Michael W. Sales

[57] ABSTRACT

A two-terminal voltage or current matched solar cell has up to four photovoltaically active junctions which efficiently convert solar radiation into electricity. The solar cell comprises GaInP, GaAs, and GaInAsP, and in the four junction case, GaInAs is used as well. The invention allows the solar spectrum to be converted into electricity more efficiently than previously.

15 Claims, 3 Drawing Sheets

HIGH EFFICIENCY MULTI-JUNCTION SOLAR CELLS

BACKGROUND OF THE INVENTION

1. Field of the Invention

This invention relates to solar cells, and more specifically to multi-junctioned solar cells that efficiently convert solar radiation into electrical energy.

2. Description of the Related Art

Solar cells are photovoltaic devices that use semiconductors to convert photons into electrical energy. In a semiconductor, a conduction band and a valence band are separated by an energy gap $E_g$ that varies with material composition and temperature. When a photon is absorbed by a semiconductor, an electron is promoted from the valence band into the conduction band, thereby creating a hole in the valence band. Since a hole represents the absence of an electron, it can be regarded as a positive charge carrier. When donor or n-type impurities (which increase the number of electrons available to carry current) are added to one side of a semiconductor crystal and acceptor or p-type impurities (which increase the number of holes) to the other, a p-n junction is formed that permits current flow in one direction but restrains it in the opposite direction. Thus, p-n junctions are ideal for converting solar radiation into electricity.

A photon of wavelength $\lambda$ (as measured in a vacuum) and frequency $\nu$ has an energy $h\nu=hc/\lambda$ and can be absorbed by a semiconductor when $h\nu \geq E_g$. However, any extra energy in the photon ($h\nu - E_g$) is converted into thermal rather than electrical energy, since only one electron-hole pair can be created for each absorption event. On the other hand, a semiconductor is more transparent to wavelengths corresponding to energies less than $E_g$, since in this case the photons are not energetic enough to promote electrons from the valence band into the conduction band. Thus, no single semiconducting material can convert the entire solar spectrum into electrical energy, since the most energetic photons produce largely thermal energy and are therefore inefficiently utilized, while the least energetic photons cannot be absorbed. However, by cascading the p-n junctions of different materials, the overall conversion efficiency can be improved. In so-called "tandem" solar cells, a top cell having a p-n junction of a high energy band gap semiconductor intercepts the most energetic photons. Lower energy photons pass through the top cell before they enter another cell having a p-n junction of a lower energy band gap semiconductor. In this way, an additional portion of the solar spectrum is used.

In tandem solar cells, tunnel junctions are often used to connect p-n junctions, so that current can pass from one cell to the next. For example, a top cell having an n layer on top of a p layer can be connected to an n on p bottom cell with a tunnel junction located between the top and bottom cells, with the tunnel junction comprising a heavily doped p layer on top of a heavily doped n layer (designated herein as $p^{++}$ and $n^{++}$, respectively). The tunnel junction acts like a shorting junction or direct current connection point. However, all of these various layers must have thermal properties and lattice spacings which are compatible with each other. Otherwise, internal strains will be introduced during the epitaxial growth process, resulting in defects which will then propagate throughout the entire structure.

An example of a tandem solar cell is the GaInP/GaAs dual junction cell grown on a GaAs substrate, which is described by S. Kurtz et al. in "19.6% Electron-Irradiated GaInP/GaAs Cells," Proceedings of 1st WCPEC (World Conference on Photovoltaic Energy Conversion), pp. 2108–2111, 1994. This tandem solar cell produced 25.7% beginning of life conversion efficiency of the air mass zero (AMO) solar spectrum, which is the pure solar spectrum with no atmospheric absorption. GaInP/GaAs cells have also been grown on Ge substrates, as reported by P. K. Chiang in "Large Area GaInP$_2$/GaAs/Ge Multijunction Solar Cells for Space Applications," Proceedings of 1st WPCEC, pp. 2120–2123, 1994. Chiang et al. predict the conversion efficiency to be slightly better when the Ge is active (i.e., the Ge and GaAs layers form a third junction), than in the dual junction case in which the Ge is inactive and acts simply as a mechanical platform (26.5 vs. 24.2% for AMO at 28° C.). This is so because the additional active layer results in more efficient use of the solar spectrum.

However, either GaInAsP or GaInAs alone is a more efficient converter of the IR than Ge at wavelengths greater than 0.89 microns (corresponding to the band gap of GaAs), as indicated by M. W. Wanlass et al. in "Development of High-Performance GaInAsP Solar Cells for Tandem Solar Cell Applications," Proceedings of the 21st IEEE Photovoltaic Specialists Conference, pp. 172–178, 1990. However, GaInAsP and GaInAs have lattice spacings quite different from Ge, so that it is not possible to construct a monolithic structure by simply epitaxially depositing one layer on top of another. Semiconductors having different lattice structures can be connected, however, by using transparent adhesive layers to connect semiconductor layers both mechanically and optically. (See, for example, J. C. C. Fan et al., "Optimal Design of High-Efficiency Tandem Cells," 16th IEEE Photovoltaic Specialists Conference, pp. 692–704, 1982.) In this case, the cells must be connected with metallic parts such as wires or a metallic grid, rather than with tunnel junctions.

Combining cells to create a tandem solar cell does have limitations. When cells are connected in series, the total voltage is the sum of the voltage drops across the individual cells, and the total current produced is limited by that cell which is the smallest current producer. In this case, the various cells must be current matched to each other in order to optimize performance. This can be done by either modifying a cell's chemical composition or by varying its thickness, so that more or fewer photons are absorbed in a particular cell as required. On the other hand, cells can also be connected in parallel so that their currents add. However, if the voltages of the different cells are mismatched, it may be necessary to connect a cell with, say, two additional cells of the same type in series to form a triplet, which can then be connected in parallel with the cell or cells of the other material. In this case, the result is a voltage matched device in which the current outputs of the two different materials are added. This technique has been reported by Fraas et al. in "A High Performance Photovoltaic Array: The Mini-Dome Fresnel Lens Concentrator with 30% Efficient GaAs/GaSb Tandem Cells," Proceedings of the 22nd IEEE Photovoltaic Specialists Conference, pp. 1485–1490, 1991. Fraas et al. connected three GaAs top cells to each other in parallel and three GaSb bottom cells to each other in series. The GaAs top cells were then connected with the GaSb bottom cells in parallel to form a two terminal, voltage matched network.

Solar cell efficiencies are relatively low, however, since solar cells utilize significant portions of the solar spectrum rather poorly, particularly the infrared (IR). Because a significant fraction of the solar spectrum is IR radiation, a solar cell which could efficiently harness this energy would have a significantly higher overall conversion efficiency.

However, tandem cells using two IR cells such as GaInAsP and GaInAs have not been constructed, and dual junction cells have not been used in either a voltage matched configuration or as the top cell in a mechanical stack that uses a transparent adhesive layer.

SUMMARY OF THE INVENTION

In accordance with the present invention, photovoltaic devices are disclosed which improve upon existing solar energy to electrical energy conversion efficiencies by using materials that are more efficient than prior art combinations in converting the IR.

The invention connects high energy band gap materials (such as GaInP and GaAs) to low energy band gap material (s) designed for the IR with a transparent adhesive. IR photons pass through the high energy band gap materials and then the transparent adhesive before entering the low energy band gap materials. The high energy band gap and low energy band gap materials are electrically connected to each other, preferably with metallic interconnects. In one embodiment of the invention, GaInP, GaAs, GaInAsP and GaInAs cells are connected in series in a current matched configuration. Alternatively, GaInP and GaAs can be connected in series with GaInAsP alone.

In the preferred embodiment, a voltage matched configuration is used in which a plurality of low energy band gap cells are connected in series. The output from the low energy band gap cells is then connected in parallel with the output of high energy band gap cells to form a voltage matched, two terminal device. Specifically, three GaInAsP/GaInAs cells are connected in series to form a low energy band gap unit, while a GaInP and a GaAs cell are connected in series to form a high energy band gap unit. The output from the high and low energy band gap units are connected in parallel in a voltage matched configuration, which modeling suggests should yield conversion efficiencies of up to 35%.

GaInP and GaAs p-n junctions are preferably connected by tunnel junctions, as are GaInAsP and GaInAs p-n junctions. Since transparent adhesive connects the higher energy band gap GaInP and GaAs cells to the lower energy band gap GaInAsP and GaInAs cells, the need for matching the GaAs and GaInAsP lattice structures is obviated. The preferred embodiments disclosed herein are designed for two terminals, which facilitates connecting the electrical output of these devices to existing electrical products.

Further features and advantages of the invention will be apparent to those skilled in the art from the following detailed description, taken together with the accompanying drawings.

DETAILED DESCRIPTION OF THE INVENTION

Figure 1:
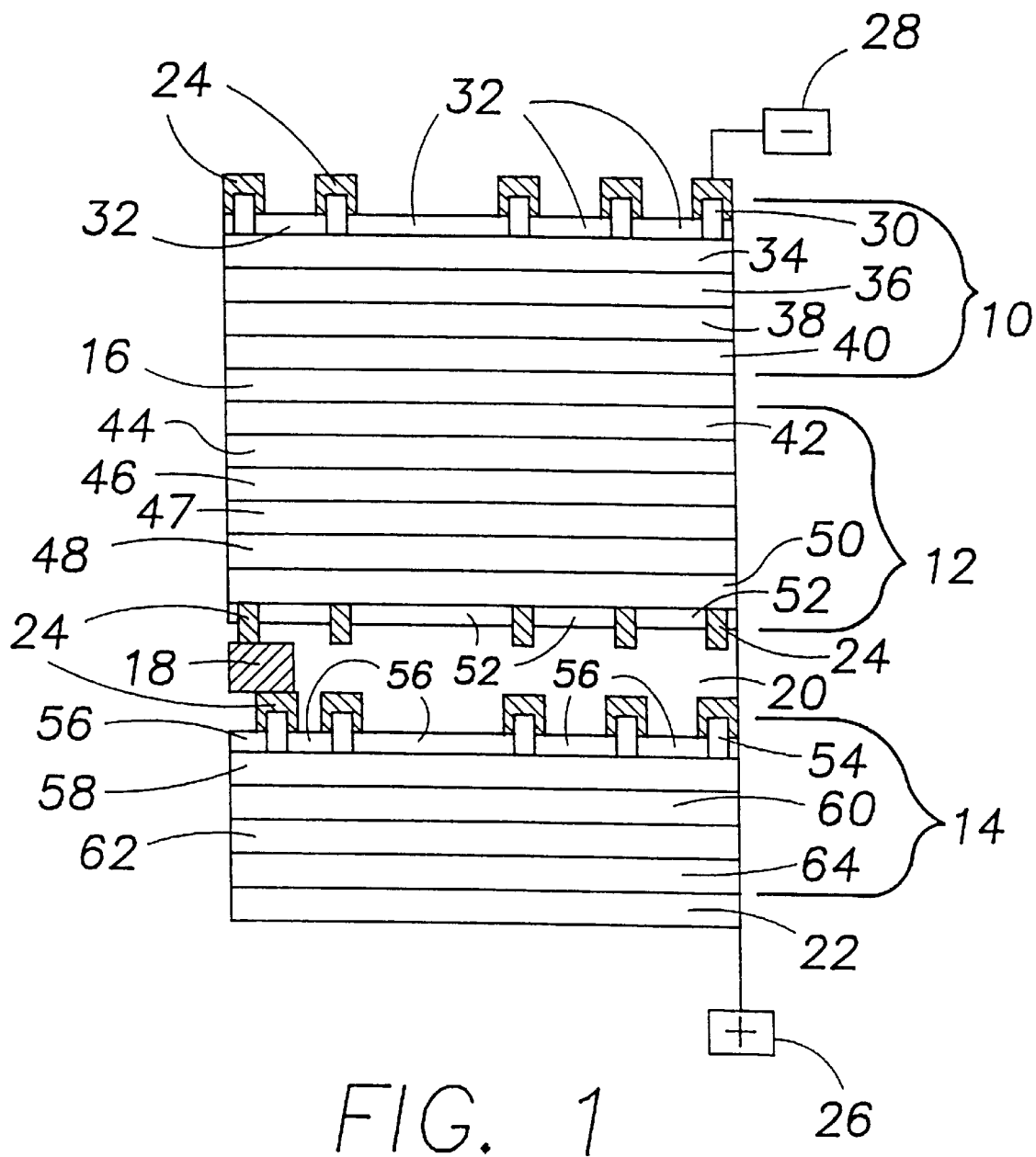
FIG. 1 is an illustrative sectional view of a series connected, two terminal photovoltaic device comprising GaInP, GaAs and GaInAsP cells.

As shown in the accompanying drawings, the present invention is directed to photovoltaic devices that improve upon existing solar energy to electrical energy conversion efficiencies. In FIG. 1, a GaInP cell 10, a GaAs cell 12 and a GaInAsP cell 14 having energy band gaps $E_g$ of nominally 1.85, 1.45 and 1.03 eV, respectively, each convert a different portion of the solar spectrum into electricity which is related to the $E_g$ of that cell. The GaInP cell 10 has the highest energy band gap of the three cells and converts photons in the wavelength region extending from nominally 0.35 to 0.67 microns. Longer wavelength photons pass through cell 10 and enter the GaAs cell 12, which responds to incoming photons having wavelengths nominally less than 0.89 microns. Photons having wavelengths nominally greater than 0.89 microns reach the GaInAsP cell 14 where they can be converted to electrical energy provided they have a wavelength that is nominally less than 1.3 microns. In each case, the long wavelength cutoff is determined by $E_g$. GaInP cell 10 is indicated in FIG. 1 as being on top and removes the highest energy photons first. GaInP cell 10 and GaAs cell 12 are connected electrically by a tunnel junction 16 that is comprised preferably of GaAs, since GaInP and GaAs have comparable lattice spacings. The preferred thickness, material and doping of tunnel junction 16 and the other semiconductor layers are provided in Table 1 at the end of the specification. GaAs and GaInAsP having an $E_g$<1.03 eV, on the other hand, do not have comparable lattice spacings. Thus, GaAs cell 12 and GaInAsP cell 14 are connected mechanically by a transparent adhesive layer 20 such as Dow Corning Company adhesive 93–500. The preferred method for doing this is to use a pipette to meter a small amount of the adhesive (with curing catalyst) onto the GaInAsP cell 14, place cell 14 underneath cell 12, and allow surface tension and gravity to cause the adhesive to spread out to form a thin bond layer between 25 and 125 microns thick. The composite unit may then be cured for about 6 hours at 70° C. or allowed to cure at room temperature for about 24 hours. An alternative method using a Teflon™ bonding technique is described by C. A. Kitchen, A. A. Dollery, K. Mullaney, and K. Bogus in "Teflon Bonding of Solar Cell Assemblies Using Pilkington CMZ and CMG Coverglasses—Now a Production Process", 1st WCPEC, pp. 2058–2061, Dec. 5–9, 1994. Although this process was developed for attaching a cell coverglass to a solar cell front surface, those skilled in the art will appreciate that Teflon™ could be used to join solar cells using a similar process. The transparent adhesive layer 20 and the tunnel junction 16 both allow the passage of photons with substantially no absorption. GaInAsP cell 14 is formed on a substrate 22 that provides mechanical support as well as lattice sites necessary for epitaxial growth. Substrate 22 also functions as a conductor of charge carriers.

Current from GaAs cell 12 flows towards GaInAsP cell 14 through a metallic interconnect 18 (which may be wires, straps, or other metallic parts) that is connected to conductive gridlines 24 adjoining cells 12 and 14. The metallic interconnect 18 is preferably 25 micron thick Ag, Ag-plated Kovar™ or Ag-plated Mo and is only located on one end of the device to reduce the blockage of photons. The interconnect 18 may be connected to the gridlines 24 by parallel gap welding, a well proven process for space solar cell interconnection. The gridlines 24 for collecting current run along the length of the device, parallel to the tunnel junction 16, and are connected to each other by bus bars that are not shown in the figures. The total area of the gridlines 24 is kept small so that they block only a small portion of the incoming photons. They are preferably Ag of between 5–20 microns thickness and are separated by about 0.5 millimeters. As indicated in FIG. 1, cells 10, 12 and 14 are connected in series in a current matched configuration. A positive terminal 26 is tied to substrate 22 at one end of the device, and a negative terminal 28 is tied to the gridlines 24 located at the other end of the device. Conductive metal contacts can be used for terminals 26 and 28.

The preferred materials of GaInP cell 10, GaAs cell 12 and GaInAsP cell 14 are indicated in Table 1. GaInP cell 10 comprises a capping region 30, an antireflection coating 32, a window 34, a GaInP n-layer 36, a GaInP p-layer 38 and a back surface field (BSF) layer 40. The n- and p-layers 36 and 38 form a p-n junction and are protected from physical damage by the capping region 30 that separates the gridlines 24 from the rest of the GaInP cell 10. Capping region 30 is preferably $n^{++}$ (heavily doped) GaAs. The antireflection coating 32 adjoins capping region 30 and preferably comprises $Al_2O_3$ and $TiO_2$. Coating 32 reduces reflection losses from GaInP cell 10 over the total response band of the invention. Window 34 is adjacent to coating 32 and GaInP n-layer 36 and is preferably n-AlInP. Window 34 is a passivation layer, i.e. it permits better current collection by lowering the recombination rate of electrons and holes that would otherwise occur between coating 32 and n-layer 36, thereby improving the efficiency of cell 10. The BSF layer 40 provides a local internal potential adjacent to the p-layer 38 and acts as a barrier to minority carrier current flow, so that these carriers can be collected more efficiently.

The tunnel junction 16, preferably comprising $p^{++}/n^{++}$ GaAs, connects GaInP cell 10 to GaAs cell 12. GaAs cell 12 is constructed much like GaInP cell 10. It includes a window 42 which is preferably GaInP and, like window 34, acts as a passivation layer. Window 42 is located between tunnel junction 16 and a GaAs n-layer 44 that in turn overlies a GaAs p-layer 46. GaAs n-layer 44 and GaAs p-layer 46 form a p-n junction. Between the other side of GaAs p-layer 46 and a buffer layer 48 that is preferably p-type GaAs is a p-GaInP BSF layer 47 that functions like BSF layer 40. Buffer layer 48 is formed on a substrate 50 that is also preferably GaAs. Layer 48 is of sufficient thickness to ensure that layers grown over it are near defect-free, but it is only lightly doped to reduce free carrier absorption, thus enhancing the transmission of IR photons into GaInAsP cell 14. An antireflection coating 52 (preferably $Al_2O_3/TiO_2$) applied to substrate 50 also increases the transmission of IR radiation into cell 14.

IR photons not absorbed in cell 12 enter GaInAsP cell 14. A capping region 54, preferably made of GaInAs, protects the rest of cell 14 from mechanical damage and has low electrical resistance to reduce losses. An antireflection coating 56 adjoins capping region 54 and is located between adhesive layer 20 and a window 58. Coating 56 is preferably made of $Al_2O_3$ and $TiO_2$ and is applied to window 58 in a thickness that optimizes IR transmission into cell 14. Window 58 also reduces the recombination of electrons and holes on a GaInAsP n-layer 60, which underlies window 58. The GaInAsP n-layer 60 overlies a GaInAsP p-layer 62, thereby forming a p-n junction. A buffer/BSF layer 64 that is preferably composed of p-InP separates the GaInAsP p-layer 62 from substrate 22 and also acts as a BSF layer. Substrate 22 is preferably InP, although In-based materials deposited on Ge or Si substrates might be used as well. The substrate may also be thin InP produced by a thin film epitaxial lift off (ELO) technique such as that described by E. Yablonovitch et al. in "Extreme selectivity in the lift-off of epitaxial GaAs films," Applied Physics Letters, pp. 2222–2224, 1987. Likewise, the other substrates discussed herein may be formed by a similar technique.

Figure 2:
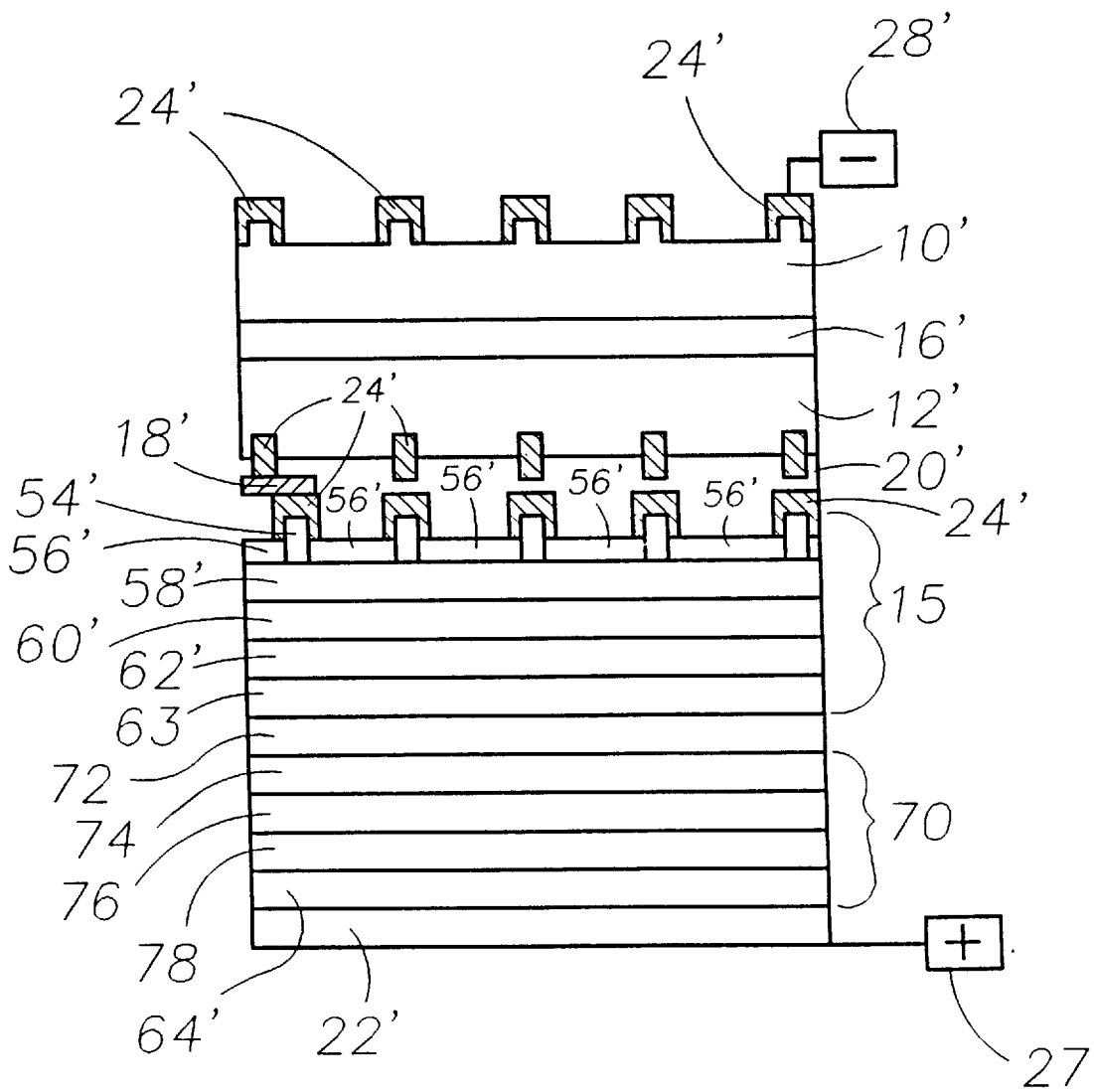
FIG. 2 is a illustrative sectional view of a series connected, two terminal photovoltaic device comprising GaInP, GaAs, GaInAsP and GaInAs cells.

FIG. 2 shows a four junction, two terminal photovoltaic device which includes an additional cell to better utilize the IR portion of the solar spectrum. Like the device indicated in FIG. 1, this device is a series connected, current-matched device. It comprises a GaInP cell 10', a GaAs cell 12', a GaInAsP cell 15 and a GaInAs cell 70. GaInAs has an $E_g$ of 0.75, making it a good material for absorbing IR photons up to 1.7 microns. Photons having wavelengths longer than nominally 1.3 microns will pass through cells 10', 12' and 15 without being absorbed. Thus, the embodiment of the invention shown in FIG. 2 utilizes the spectral region between nominally 1.3 and 1.7 microns, which does not contribute to the generation of photovoltaic current in the device shown in FIG. 1. GaInP cell 10' and GaAs cell 12' are constructed and function like their counterparts shown in FIG. 1, cells 10 and 12. Analogous parts have the same reference number with the addition of a prime. Likewise, a tunnel junction 16' and a transparent adhesive layer 20' are analogous to elements 16 and 20, respectively. All of the prime numbered elements within GaInAsP cell 15 have counterparts in cell 14 that function in substantially the same way. BSF layer 63 is the bottommost layer of cell 15 and is analogous to BSF layer 47 in cell 12.

A tunnel junction 72 connects cell 15 with cell 70. Tunnel junction 72 is preferably formed from $p^{++}/n^{++}$ GaInAsP or GaInAs and provides a low electrical resistance between the GaInAsP cell 15 and the GaInAs cell 70. Cell 70 includes a window 74 that is adjacent to tunnel junction 72 and reduces the recombination rate of holes and electrons. On the other side of window 74 is a GaInAs n-layer 76 that mates with a GaInAs p-layer 78 to form a GaInAs p-n junction. On the other side of p-layer 78 is a buffer/BSF layer 64' that is formed on a substrate 22'. Buffer/BSF layer 64' and substrate 22' function like their counterparts 64 and 22 in FIG. 1. Substrate 22' is connected to a positive terminal 27 at one end of the device, and a negative terminal 28' is connected to gridlines 24' at the other end to form a two terminal device. The gridlines 24' are connected to each other by bus bars that are not shown. Current from GaAs cell 12' flows towards GaInAsP cell 15 through a metallic interconnect 18' that is connected to gridlines 24' adjoining cells 12 and 15, analogous to the device shown in FIG. 1.

Figure 3:
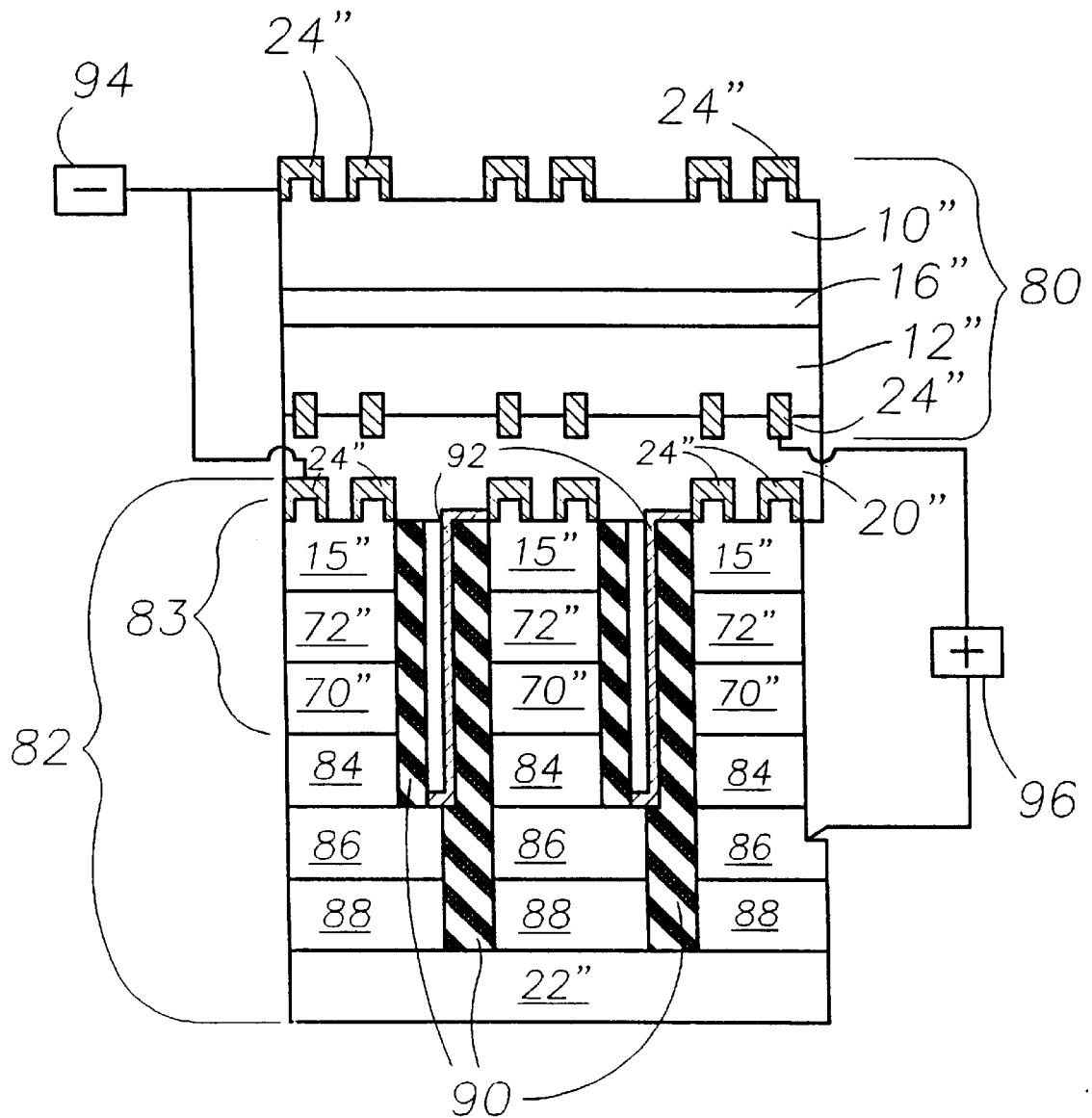
FIG. 3 is a illustrative sectional view of a voltage matched, two terminal photovoltaic device comprising GaInP, GaAs, GaInAsP and GaInAs cells.

The preferred embodiment of the invention is a four junction, voltage matched, two terminal photovoltaic device shown in FIG. 3. This embodiment is more tolerant of changes in current generation that would otherwise limit performance of the invention. It includes a GaInP cell 10" and a GaAs cell 12" connected in series in a current matched configuration. Cells 10" and 12", a tunnel junction 16" connecting cells 10" and 12", and gridlines 24" connected to cells 10" and 12" form a high energy band gap unit 80. The elements of high energy band gap unit 80 function just like their counterparts shown in FIG. 2, namely cells 10', 12', 16' and 24'.

The high energy band gap unit 80 is joined to a low energy band gap unit 82 by a transparent adhesive layer 20" that functions like its counterpart in FIG. 2, layer 20'. The low energy band gap unit 82 comprises a plurality of GaInAsP cells 15" and GaInAs cells 70" that are connected by tunnel junctions 72" to form GaInAsP/GaInAs cells 83. Cells 15" and 70" function like their counterparts cells 15 and 70 of FIG. 2. Low energy band gap unit 82 further includes gridlines 24" between the GaInAsP cells 15" and the overlying adhesive layer 20", as well as tunnel junctions 84 that connect the GaInAs cells 70" to lateral conduction layers 86. The gridlines 24" are connected by bus bars (not shown) like their counterparts in FIGS. 1 and 2. The conduction layers 86 are preferably $n^{++}$ InP and function as low resistance current carriers. Isolation regions 88 for each cell 83 separate conduction layers 86 from a substrate 22" which, like its counterparts 22 and 22', can be InP or InP on a silicon or germanium substrate. Alternatively, a semi-insulating InP substrate may also be used, thereby obviating the need for isolation regions 88. Substrate 22", layers 86, and isolation regions 88 also form part of the low energy band gap unit 82. The isolation regions 88 can be formed by the sequential deposition of n and p InP layers (either n on p or p on n), and restrain current from flowing into the substrate 22". The GaInAsP/GaInAs cells 83 are laterally separated from each other by a dielectric region 90 such as 0.8 micron thick $SiO_2$, and are connected to each other by monolithic series interconnects 92. Each interconnect 92 connects the lateral conduction layer 86 for one cell 83 to the gridlines 24" adjoining an adjacent cell 83, so that the GaInAsP/GaInAs cells 83 are connected in series. These connections can be established by well known photolithography and metalization steps. As indicated in FIG. 3, the output from the low energy band gap unit 82 is connected in parallel with the output from the high energy band gap unit 80 by connecting gridlines 24" at the upper end of unit 80 with one end of the series-connected GaInAsP/GaInAs cells 83, and also connecting together gridlines 24" at the lower end of unit 80 with the lateral conduction layer 86 at the opposite end of the series-connected cells 83. This forms a voltage matched device with a negative terminal 94 and a positive terminal 96. Modeling of this device indicates that it will be properly voltage matched when three series connected GaInAsP/GaInAs cells 83 are used in the low energy band gap unit 82.

Although the embodiments disclosed herein always show cells with n layers on top of p layers, analogous devices having p layers on top of n layers can also be constructed, provided that the electrical connections and tunnel junctions are adjusted accordingly. Furthermore, an additional tunnel junction may be utilized to connect buffer layers (in any cell) to a substrate of the opposite polarity type (e.g. p-type layer 48 could be connected to an n-type substrate using a $p^{++}/n^{++}$ tunnel junction.) Conventional epitaxial techniques can be used to fabricate the semiconductor layers, including the p-n junctions, buffer layers, tunnel junctions, and windows, resulting in monolithic structures. Antireflection coatings can be formed with electron beam evaporation or sputtering techniques. Capping regions and their associated gridlines can be constructed through conventional photoresist and etching processes, although a preferred technique for doing this is described in U.S. Pat. No. 5,330,585 entitled "Gallium Arsenide/Aluminum Gallium Arsenide Photocell Including Environmentally Sealed Ohmic Contact Grid Interface and Method of Fabricating the Cell," issued Jul. 19, 1994 to K. Chang and B. T. Cavicchi.

Preferred techniques for fabricating and interconnecting individual solar cells can be found in a co-pending patent application to K. Chang and D. R. Lillington entitled "Monolithically Integrated Solar Cell Microarray and Fabrication Method," (Ser. No. 80/572257, filed Dec. 13, 1995). In particular, low energy band gap unit 82, which comprises GaInAsP/GaInAs cells 83 connected in series, can be fabricated by a series of photolithographic masking, etching and deposition steps commonly used in semiconductor processing. One preferred technique is to first epitaxially deposit all the various semiconductor layers that make up low energy band gap unit 82, followed by etching a thin channel (50 microns wide) through the layers that make up cells 15", tunnel junctions 72", cells 70", and tunnel junctions 84, all the way down to or even into the lateral conduction layer 86. An additional "stop etch" layer comprising a material such as GaInP, although not required, may be used between tunnel junction 84 and lateral conduction layer 86 to assist in the fabrication process. A second photolithography process is then used to extend the etch channel (but at a reduced width of 25 microns) through lateral conduction layer 86 and isolation region 88 down to or even into the substrate 22", thereby forming separate columns of semiconductor layers above substrate 22". Deposition of dielectric region 90 (preferably 0.8 micron thick $SiO_2$) is then performed with sputtering or preferably low pressure chemical vapor deposition. A further photolithographic step is then used to define the boundaries of each dielectric region 90 and to open up a small recess therein to expose lateral conduction layers 86, as viewed from above. An additional lift off process comprising photolithography with metal deposition is then used to define the monolithic series interconnects 92.

While particular embodiments of the invention have been shown and described, numerous variations and alternate embodiments will occur to those skilled in the art. Accordingly, it is intended that the invention be limited only in terms of the appended claims.

TABLE 1

Preferred material, thickness and dopant densities for the various semiconductor layers (all primed numbered layers have the same characteristics as their unprimed counterparts).

| Layer | Material/Function | Thickness (microns) | Dopant density (cm-3) |
|---|---|---|---|
| 16 | p++/n++ GaAs tunnel junction | 0.011/0.011 | 1E19 to 1E20, C or Zn (p-type) 1E19 to 1E20, Si or Te (n-type) |
| 22 | p-InP substrate | 3 (ELO) or 600 (free standing layer) | 1 to 5 E18, Zn |
| 30 | n-GaAs cap | 0.5 | >1E19, Zn |
| 34 | n-AlInP window | 0.025 | 4E17, Si |
| 36 | n-GaInP emitter | 0.1 | 2E18, Si |
| 38 | p-GaInP base | 0.5 | 1.5E17, Zn |
| 40 | p-GaInP BSF | 0.05 | 3E18, Zn |
| 42 | n-GaInP window | 0.1 | 1E18, Si |
| 44 | n-GaAs emitter | 0.1 | 1E18, Si or Te |
| 46 | p-GaAs base | 3.5 | 8E16, Zn |
| 47 | p-GaInP BSF | 0.07 | 3E17, Zn |
| 48 | p-GaAs buffer | 0.2 | 3E17, Zn |
| 50 | p-GaAs substrate | 3 (ELO) or 300 (free standing layer) | 1 to 5E17, Zn (p-type) 1 to 5E17, Si (n-type) |
| 54 | n-GaInAs cap | 0.5 to 1 | >5E18, S |
| 58 | n-AlInAs (or InP) window | 1.5 | 1E18, S |
| 60 | n-GaInAsP emitter | 0.2 | 1E18, S |
| 62 | p-GaInAsP base | 4 | 1E17, Zn |
| 63 | p-InP BSF | 0.1 | 3E17, Zn |
| 64 | p-InP buffer/BSF | 0.4 | 1E18, Zn |
| 72 | p++/n++ GaInAsP tunnel junction | 0.011/0.011 | 1E19 to 1E20, C or Zn (p-type) 1E19 to 1E20, Si or Te (n-type) |
| 74 | n-InP window | 0.1 | 1E17, S |
| 76 | n-GaInAs emitter | 0.2 | 1E18, S |
| 78 | p-GaInAs base | 4 | 1E17, Zn |
| 84 | p++/n++ GaInAs tunnel junction | 0.011/0.011 | 1E19 to 1E20, Zn (p-type) 1E19 to 1E20, Sn (n-type) |
| 86 | n++ InP conduction | 2 | 1E19, Sn or S |
| 88 | p/n/p InP isolation | 0.2/0.2/0.2 | 1E17, S (n-type) 1E17, Zn (p-type) |

We claim:
1. A photovoltaic device for converting photons into electrical energy, comprising:

GaInP, GaAs and GaInAsP cells, wherein said cells are connected to each other in a tandem configuration such that photons enter said GaInP, GaAs and GaInAsP cells in turn.

2. The device of claim 1, wherein said GaInP, GaAs and GaInAsP cells produce electrical energy from photons having wavelengths as measured in a vacuum between nominally 0.35 and 0.67, 0.67 and 0.89, and 0.89 and 1.3 microns, respectively.

3. The device of claim 1, further comprising a substantially transparent adhesive layer mechanically joining said GaAs and GaInAsP cells.

4. The device of claim 1, wherein said GaInP, GaAs, and GaInAsP cells are electrically connected in series.

5. The device of claim 4 further including output terminals at opposite ends of said GaInP and GaInAsP cells.

6. A photovoltaic device for converting photons into electrical energy, comprising:

GaInP, GaAs, GaInAsP and GaInAs cells, wherein said cells are connected to each other in a tandem configuration such that photons enter said GaInP, GaAs, GaInAsP and GaInAs cells in turn.

7. The device of claim 6, wherein said GaInP, GaAs, GaInAsP and GaInAs cells produce electrical energy from photons having wavelengths as measured in a vacuum between nominally 0.35 and 0.67, 0.67 and 0.89, 0.89 and 1.3, and 1.3 and 1.7 microns, respectively.

8. The device of claim 6, further comprising a substantially transparent adhesive layer mechanically joining said GaAs and GaInAsP cells.

9. The device of claim 6, wherein said GaInP, GaAs, GaInAsP and GaInAs cells are electrically connected in series.

10. The device of claim 9, further including output terminals at opposite ends of said GaInP and GaInAs cells.

11. A photovoltaic device for converting photons into electrical energy, comprising:

a high energy band gap unit including GaInP and GaAs cells electrically connected in series; and a low energy band gap unit including a plurality of GaInAsP/GaInAs cells electrically connected in series, each of said GaInAsP/GaInAs cells comprising respective GaInAsP and GaInAs cells electrically connected in series;

said high and low energy band gap units being connected in parallel.

12. The device of claim 11, wherein said GaInP, GaAs, GaInAsP and GaInAs cells produce electrical energy from photons having wavelengths as measured in a vacuum between nominally 0.35 and 0.67, 0.67 and 0.89, 0.89 and 1.3, and 1.3 and 1.7 microns, respectively.

13. The device of claim 11, further comprising a substantially transparent adhesive layer mechanically joining said GaAs and GaInAsP cells.

14. The device of claim 11, further including output terminals at opposite ends of said high and low energy band gap units.

15. The device of claim 11, wherein three GaInAsP/GaInAs cells are electrically connected in series.

* * * * *